United States Patent [19]

Shinozaki

[11] Patent Number: 5,729,500
[45] Date of Patent: Mar. 17, 1998

[54] DRAW WITH VARIABLE INTERNAL OPERATION FREQUENCY

[75] Inventor: Naoharu Shinozaki, Kawasaki, Japan

[73] Assignee: Fujitsu Limited, Kanagawa, Japan

[21] Appl. No.: 789,803

[22] Filed: Jan. 28, 1997

[30] Foreign Application Priority Data

Aug. 29, 1996 [JP] Japan .................. 8-228996

[51] Int. Cl.$^6$ .................. G11C 13/00
[52] U.S. Cl. .................. 365/230.01; 365/233
[58] Field of Search .................. 365/189.01, 230.01, 365/233

[56] References Cited

U.S. PATENT DOCUMENTS 5,084,842  1/1992  Tsuchida et al. .................. 365/230.01

*Primary Examiner*—Terrell W. Fears
*Attorney, Agent, or Firm*—Nikaido Marmelstein Murray & Oram LLP

[57] ABSTRACT

A DRAM to which a setting can be made to determine an internal operation frequency thereof includes a memory cell array, sense amplifiers writing data to and reading data from the memory cell array, a pair of data-bus lines, and gates connecting between the pair of data-bus lines and the sense amplifiers, the gates providing the pair of data-bus lines with access to the sense amplifiers when the gates are open. The DRAM further includes a control circuit controlling a period of the access to be a different period for a different setting of the internal operation frequency.

12 Claims, 15 Drawing Sheets

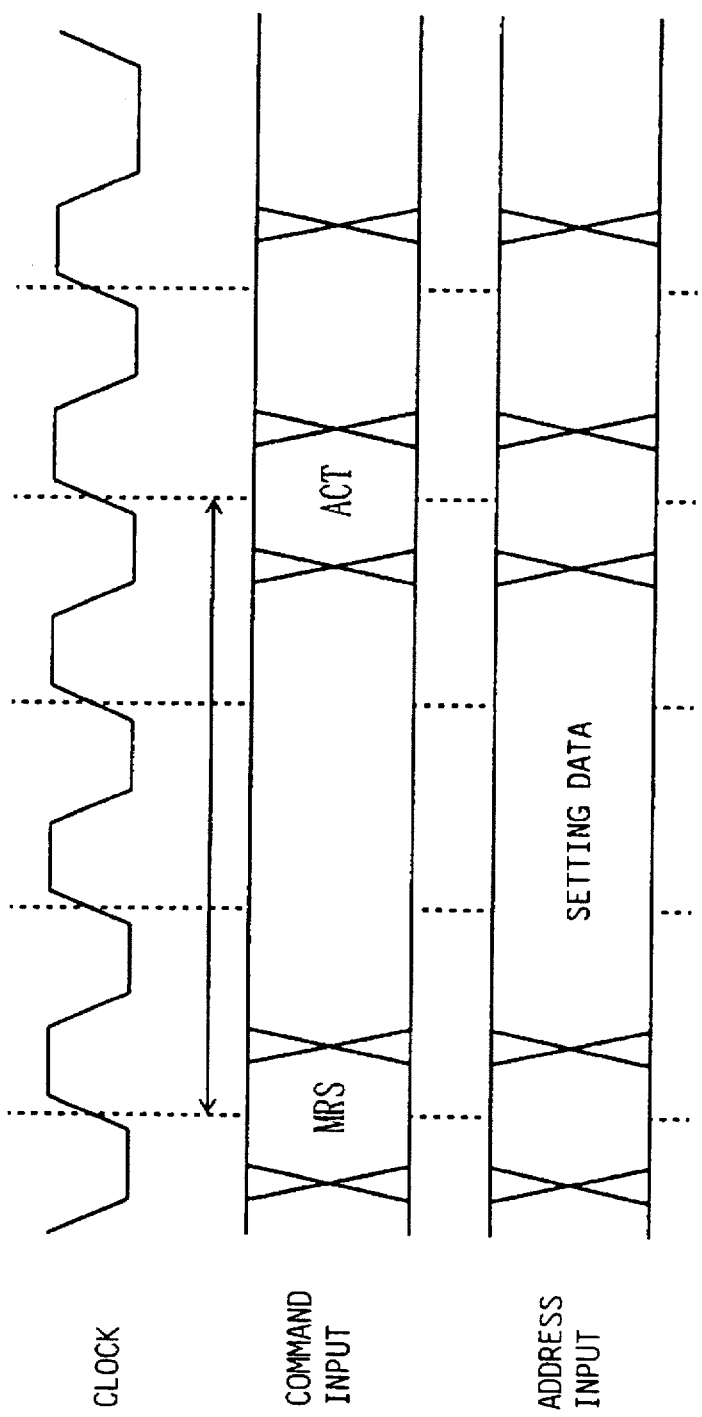

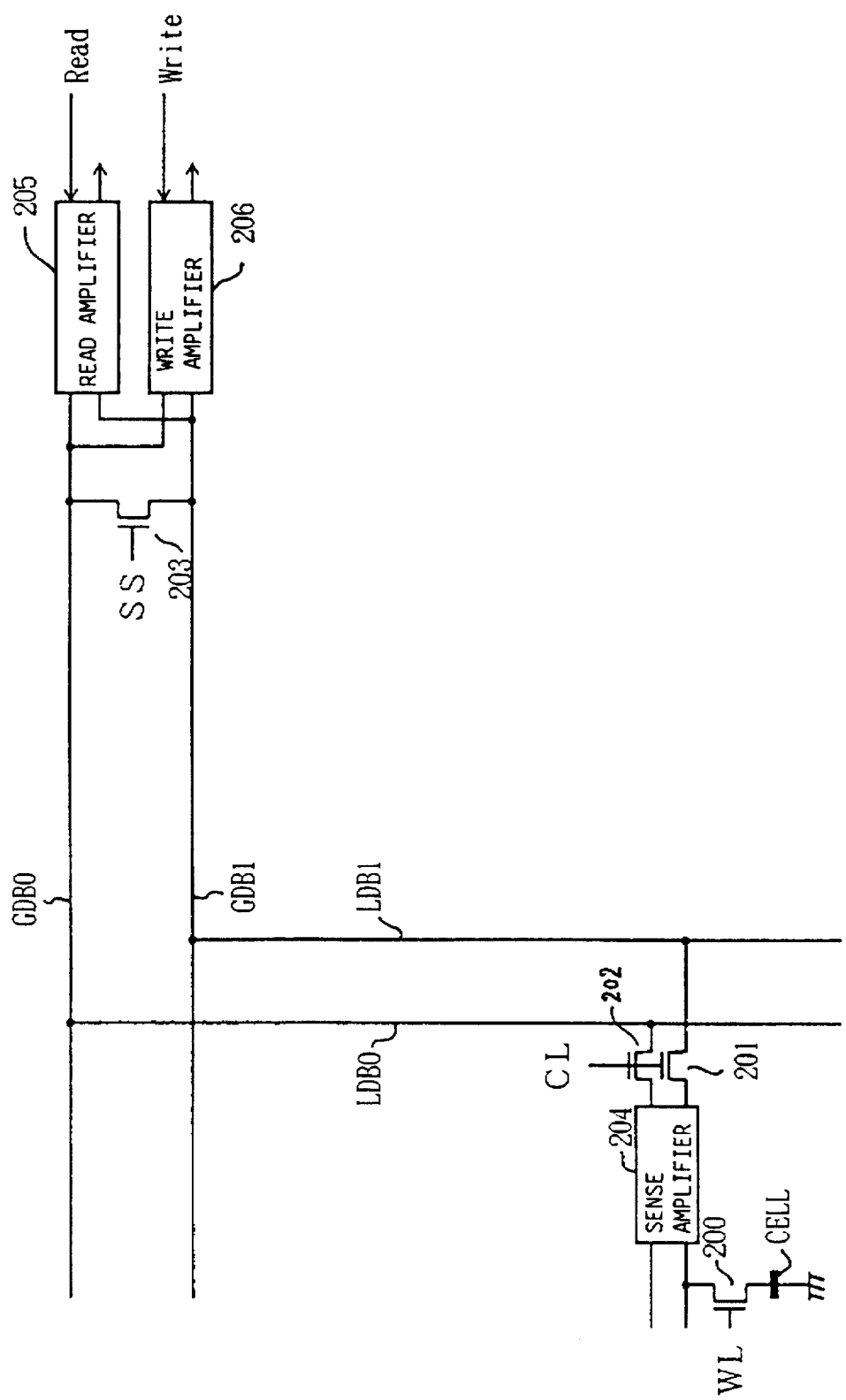

FIG. 6A CLK
FIG. 6B CLz
FIG. 6C Shortx

FIG. 7A CLK
FIG. 7B CLz
FIG. 7C Shortx

FIG. 13A CLK
FIG. 13B inz
FIG. 13C az
FIG. 13D bz
FIG. 13E cz
FIG. 13F outz
FIG. 13G CLz
FIG. 13H Shortx FIG. 14A CLK
FIG. 14B CLz
FIG. 14C Shortx

DRAW WITH VARIABLE INTERNAL OPERATION FREQUENCY

BACKGROUND OF THE INVENTION

1. Field of the Invention

The present invention generally relates to DRAMs (dynamic random access memories), and particularly relates to a DRAM allowing settings to be made to determine an internal operation frequency.

2. Description of the Related Art

SDRAMs (synchronous dynamic random access memories) generally allow settings to be made externally to various parameters to define operation modes thereof. Such parameters includes a CAS latency, a burst length, a burst type, and the like. Settings to these parameters are made by giving a mode setting instruction through a command input and providing these parameters through an address input to write the parameters in a mode register inside the SDRAMs.

FIGS. 1A through 1D are illustrative drawings for explaining settings to a mode register in an SDRAM. FIG. 1A shows a clock signal supplied to the SDRAM, and FIG. 1B shows a command input. FIG. 1C shows an address input. As shown in FIGS. 1B and 1C, a mode-register setting command MRS is given to the command input, and data to be stored in the mode register is supplied to the address input. After the data is input, an activation command ACT is provided to the command input to put the newly set mode into effect.

FIG. 1D shows relations between the address input and the data to be set in the mode register. As shown in FIG. 1D, three bits comprised of address inputs A0 through A2 are used for setting a burst length, and address bit A3 defines a burst type. Another three bits from address input A4 to address input A6 are used for setting a CAS latency. Remaining bits from address input A7 are not used at present.

The CAS latency is a parameter which defines how long a start of a data-read operation is delayed in response to an input of a data-read command. FIGS. 2A through 2D are time charts showing various data-read operations when the CAS latency is set to different values. FIG. 2A shows a case in which the CAS latency is set to 4, and FIG. 2B shows a case in which the CAS latency is 3. FIG. 2C shows an operation with the CAS latency of 2, and FIG. 2D with the CAS latency of 1. In each figure, a clock input is shown above, and output data is shown below. Further, in each figure, a first clock pulse marks an input of the command.

As shown in the figures, the larger the CAS latency, the faster the operations of the SDRAM because of the higher clock frequency. A larger CAS latency also means a longer delay until the start of the read operation in response to the command input. With the CAS latency of 4, for example, the DRAM can achieve high-speed data-read operation such as at a clock frequency of 167 MHz, but has to wait four clocks after the command input before outputting data. When the CAS latency is 1, for example, the clock frequency is about the same as that of conventional DRAMs at about 56 MHz, and the delay in the start of the data-read operation is within one clock, which is also about the same as that of conventional DRAMs.

In the following, data-read and data-write operations of the related-art SDRAMs will be described. FIG. 3 is an illustrative drawing partially showing a memory core of the related-art SDRAM.

The data-read operation is carried out as follows. When word-line selecting signal WL is turned to HIGH, a transistor 200 is turned on to supply a voltage stored in a memory cell CELL to a sense amplifier 204. The data stored in the sense amplifier 204 is supplied to local data bus LDB0 and LDB1 when a column-line selecting signal CL is turned to HIGH to turn transistors 201 and 202 on. The local data bus LDB0 and LDB1 conveys complement signals, such that one line of the bus is HIGH when the other line is LOW. The complement signals on the local data bus LDB0 and LDB1 are transferred to global data bus GDB0 and GDB1. The data on the global data bus GDB0 and GDB1 is read via a read amplifier 205 by a supplying data-read signal Read.

The use of the compliment signals in the data transmission achieves high-speed access operations. A pair of the data-bus lines are first pre-charged to a voltage lower than a power voltage, and, then, are short-circuited by a transistor 203 with short-circuit signal SS to be settled at the same voltage with each other. In continuous read operations, the pair of the data-bus lines have to be prepared for a next access operation by setting the pair of the data-bus lines to the same voltage through the precharge operation and the short-circuit operation after every access operation.

The data-write operation is carried out as follows. With data-write signal Write, data is written in a write amplifier 206 to be supplied to the global data bus GDB0 and GDB1. Following operations are the reverse of the above-described data-read operation, i.e., the data on the global data bus GDB0 and GDB1 is supplied to the sense amplifier 204 via the local data bus LDB0 and LDB1 to be stored in the memory cell CELL. Since the data-write operation is also conducted by using complement signals, the pairs of the data-bus lines have to be settled at the same voltage through the precharge operation and the short-circuit operation.

In this manner, the pair of the data-bus lines are set to the same voltage level through the precharge operation and the short-circuit operation in the data-write and data-read operations. After a settlement to the same voltage level, one line of the data bus is changed to HIGH and the other line is turned to LOW at a time when the sense amplifier 204 is accessed through the column-line selecting signal CL. These voltage changes are read as data or written as data. After these operations, the pair of the data bus lines are set to the same voltage level again through the precharge operation and the short-circuit operation in preparation for the next access to the sense amplifier.

In the data-read operation or the data-write operation, the precharge operation, the short-circuit operation, and a column selection operation have to be carried out within one cycle of the clock signal. The more time these operations are allowed to take, the more reliable these operations are.

In the example of FIGS. 2A through 2D, the longest period of one cycle is 6 ns (i.e., in the case of 167 MHz). With this highest frequency, a column-line activation period (sense-amplifier accessing period) and a short-circuit-operation period (the precharge operation is carried out simultaneously) have to divide this 6-ns period between them.

FIG. 4 is a circuit diagram of a circuit for controlling the column-line activation operation and the short-circuit operation. The circuit of FIG. 4 includes a NOR circuit 40, a signal generating unit 10, a column-line-selection-signal controlling unit 41, a short-circuit-signal controlling unit 42, a Read-signal controlling unit 43, and a Write-signal controlling unit 44. The signal generating unit 10 includes NAND circuits 11 and 12 together forming a RS flip-flop, a delay unit 13, inverters 14 and 15, and a NOR circuit 16. The delay unit 13 includes delay inverters 21 through 29 and an inverter 30.

FIGS. 5A through 5I are time charts for explaining operations of the circuit of FIG. 4. These time charts show a case in which one cycle is 6 ns, the column-line activation period is 4 ns, and the short-circuit period is 2 ns.

A signal inz input to the signal generating unit 10 via the NOR circuit 40 is an internal pulse signal internally generated in synchronism with an external clock signal CLK. In FIGS. 5A through 5I, the clock signal CLK is an external clock signal, the signal inz is an internal pulse signal, a signal az is an output of the delay unit 13, a signal outz is an output of the signal generating unit 10, a signal CLz is an output of the column-line-selection-signal controlling unit 41, a signal Shortx is an output of the short-circuit-signal controlling unit 42, a signal Readz is an output of the Read-signal controlling unit 43, and a signal Writez is an output of the Write-signal controlling unit 44. Further, a signal WEz is used for indicating either one of the data-read operation or the data-write operation.

With reference to FIG. 4 and FIGS. 5A through 5I, a change in the internal pulse signal inz from LOW to HIGH brings about a change in the state of the flip-flop comprised of the NAND circuits 11 and 12, so that the output of the NAND circuit 11 is turned to HIGH. This change in the output of the NAND circuit 11 is shown as a change from LOW to HIGH in the output signal outz shown in FIG. 5D. Also, the change in the output of the NAND circuit 11 is delayed by the delay unit 13 to appear as a rise from LOW to HIGH in the output signal az of the delay unit 13 shown in FIG. 5C. The output signal az is input to the flip-flop via the inverter 14, so that the change in the output signal az from LOW to HIGH causes a change in the output of the NAND circuit 11 from HIGH to LOW. This is shown in FIG. 5D as a fall from HIGH to LOW in the output signal outz. In this manner, with each rise in the internal pulse signal inz as a trigger, the output signal outz is turned to HIGH which lasts for a predetermined period (4 ns). This predetermined period is determined by the total delay time of the delay unit 13.

The output signal outz is supplied to the column-line-selection-signal controlling unit 41, the short-circuit-signal controlling unit 42, the Read-signal controlling unit 43, and the Write-signal controlling unit 44. The column-line-selection-signal controlling unit 41 delays the output signal outz by a predetermined delay time through delay inverters 51 through 53 and an inverter 54 to output the output signal CLz. The output signal CLz is shown in FIG. 5E, and corresponds to the column-line selecting signal CL in FIG. 3. Using delay inverters 55 through 58 and an inverter 59, the short-circuit-signal controlling unit 42 causes a delay of a predetermined amount in the output signal outz, and inverts the delayed signal to produce the output signal Shortx. The output signal Shortx is shown in FIG. 5F, and corresponds to the short-circuit signal SS of FIG. 3.

The Read-signal controlling unit 43 uses delay inverters 61 and 62 and an inverter 63 to delay the output signal outz by a predetermined delay time to produce the output signal Readz. The Write-signal controlling unit 44 delays the output signal outz by a predetermined delay amount through delay inverter 65 and inverters 66 and 67 to generate the output signal Writez. An NOR circuit 64 of the Read-signal controlling unit 43 and a NAND circuit 68 of the Write-signal controlling unit 44 receive the signal WEz as one input to control the switching between the data-read operation and the data-write operation. The output signal Readz corresponds to the data-read signal Read in FIG. 3, and the output signal Writez corresponds to the data-write signal Write in FIG. 3.

In this manner, the column-line selecting signal CL (CLz) shown in FIG. 5E is provided as a signal having reversed phase relations with the short-circuit signal SS (Shortx) shown in FIG. 5F. The HIGH period of the column-line selecting signal CL is 4 ns, and one cycle lasts for 6 ns, so that the short-circuit signal SS has a HIGH period of 2 ns. In other words, the column-line activation operation and the short-circuit operation divide one cycle between them into 4 ns and 2 ns, respectively.

FIGS. 6A through 6C are time charts showing a case in which the CAS latency is 3 and one cycle is 7 ns. FIGS. 7A through 7C are time charts showing a case in which the CAS latency is 2 and one cycle is 9 ns. Further, FIGS. 8A through 8C are time charts showing a case in which the CAS latency is 1 and one cycle is 18 ns. Each of these figures shows the external clock CLK, the column-line selecting signal CLz, and the short-circuit signal Shortx.

As shown in FIG. 4, a signal delay by the delay unit 13 is constant, so that a change in the CAS latency does not bring about a change in the pulse length (period of the signal having the HIGH level) of the column-line selecting signal CLz. The column-line selecting signal CLz remains to have a 4-ns pulse length. Namely, even when the CAS latency is reduced from 4, 3, 2, to 1, the time period for the column-line activation operation remains the same at 4 ns, as shown in FIGS. 6A through 6C to FIGS. 8A through 8C. Only the time period for the short-circuit operation changes, increasing to 3 ns, 5 ns, and 14 ns.

In field use, SDRAMs are often operated with a CAS latency of 3 as a maximum operation speed. The faster CAS latency of 4 is usually reserved for a future use with an aim to achieve a faster operation. Despite such use of SDRAMs, the column-line activation operation has a period which is determined in view of the CAS latency of 4 (e.g., 4 ns in the above example), such that the SDRAMs can operate with this CAS latency. For other smaller CAS latencies, the same period (e.g., 4 ns) is used for the column-line activation operation as described above.

Setting the column-line-activation-operation period in accordance with the CAS latency of 4 is the same as setting the column-line-activation-operation period in view of the fastest memory operation. Among memory chips actually manufactured, some chips inevitably end up having an insufficient margin for the column-line activation operation, and, thus, become deficient chips inoperable with the fastest CAS latency of 4. Since the manufactured chips have the same column-line-activation-operation period for all the CAS latencies, such deficient chips are not operable with the CAS latencies of 3, 2, and 1 as well as the fastest CAS latency of 4 as reserved for future use. As a result, the production yield is decreased.

Accordingly, there is a need for a DRAM which is operable with CAS latencies other than the fastest CAS latency corresponding to the highest operation frequency even if it is inoperable with the fastest CAS latency.

SUMMARY OF THE INVENTION

Accordingly, it is a general object of the present invention to provide a DRAM which can satisfy the need described above.

It is another and more specific object of the present invention to provide a DRAM which is operable with CAS latencies other than the fastest CAS latency corresponding to the highest operation frequency even if it is inoperable with the fastest CAS latency.

In order to achieve the above object according to the present invention, a DRAM to which a setting can be made to determine an internal operation frequency thereof includes a memory cell array, sense amplifiers writing data to and reading data from the memory cell array, a pair of data-bus lines, and gates connecting between the pair of data-bus lines and the sense amplifiers, the gates providing the pair of data-bus lines with access to the sense amplifiers when the gates are open. The DRAM further includes a control circuit controlling a period of the access to be a different period for a different setting of the internal operation frequency.

In the above-described DRAM, as the internal operation frequency decreases, the period of access can be increased from the shortest period near an operation limit which is set in view of the CAS-latency corresponding to the fastest clock. This makes it possible to provide sufficient margins to the period of access when other CAS-latencies are used. It is thus highly probable that a DRAM chip suffering an insufficient period of access with the CAS latency of the fastest clock may be operable with other CAS latencies.

Other objects and further features of the present invention will be apparent from the following detailed description when read in conjunction with the accompanying drawings.

BRIEF DESCRIPTION OF THE DRAWINGS

FIGS. 1A through 1D are illustrative drawings for explaining settings to a mode register in an SDRAM;

FIG. 3 is an illustrative drawing partially showing a memory core of a related-art SDRAM;

DESCRIPTION OF THE PREFERRED EMBODIMENTS

In the following, a principle and an embodiment of the present invention will be described with reference to the accompanying drawings.

Figure 9:
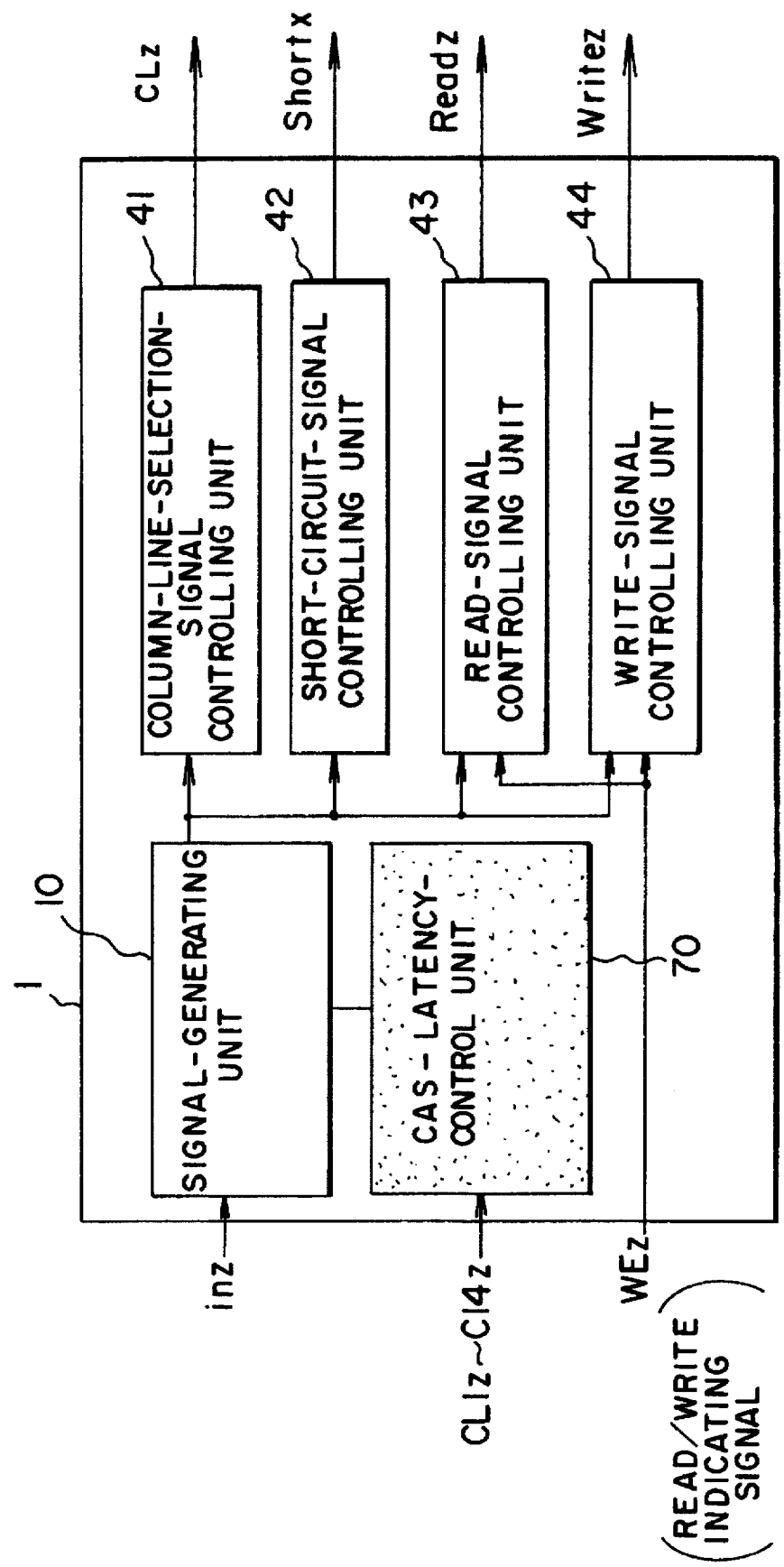
FIG. 9 is a block diagram of a read/write-control unit according to a principle of the present invention.

FIG. 9 is a block diagram of a read/write-control unit 1 according to a principle of the present invention. The read/write-control unit 1 of FIG. 9 includes the signal generating unit 10, the column-line-selection-signal controlling unit 41, the short-circuit-signal controlling unit 42, the Read-signal controlling unit 43, and the Write-signal controlling unit 44. The above-identified elements are the same as those shown in FIG. 4. The read/write-control unit 1 further includes a CAS-latency-control unit 70 which controls the signal generating unit 10 according to a CAS-latency indicating signal.

The CAS-latency-control unit 70 receives CAS-latency indicating signals CL1z through CL4z which indicate current settings of the CAS latency, and controls the signal generating unit 10 to cause changes in the column-line-activation period and the short-circuit period according to the CAS-latency indicating signals. For example, the CAS-latency-control unit 70 brings about increases in the column-line-activation period and the short-circuit period in proportion to an increase in the period of one cycle, which accompanies a decrease in the CAS latency. If a ratio of the column-line-activation period to the short-circuit period is 2 to 1 with the CAS latency of 4, for example, the ratio of the column-line-activation period to the short-circuit period is kept at 2 to 1 with other CAS latencies of 3, 2, and 1.

In this manner, as an operation speed decreases, the column-line-activation period and the short-circuit period are increased from the shortest periods near operation limits, which are set in view of the CAS-latency corresponding to the fastest clock. This makes it possible to provide sufficient margins to both the column-line-activation period and the short-circuit period when other CAS-latencies are used. It is thus highly probable that a DRAM chip suffering an insufficient column-line-activation period and/or an insufficient short-circuit period with the CAS latency of the fastest clock may be operable with other CAS latencies.

Figures 2A, 2B, 2C, 2D:
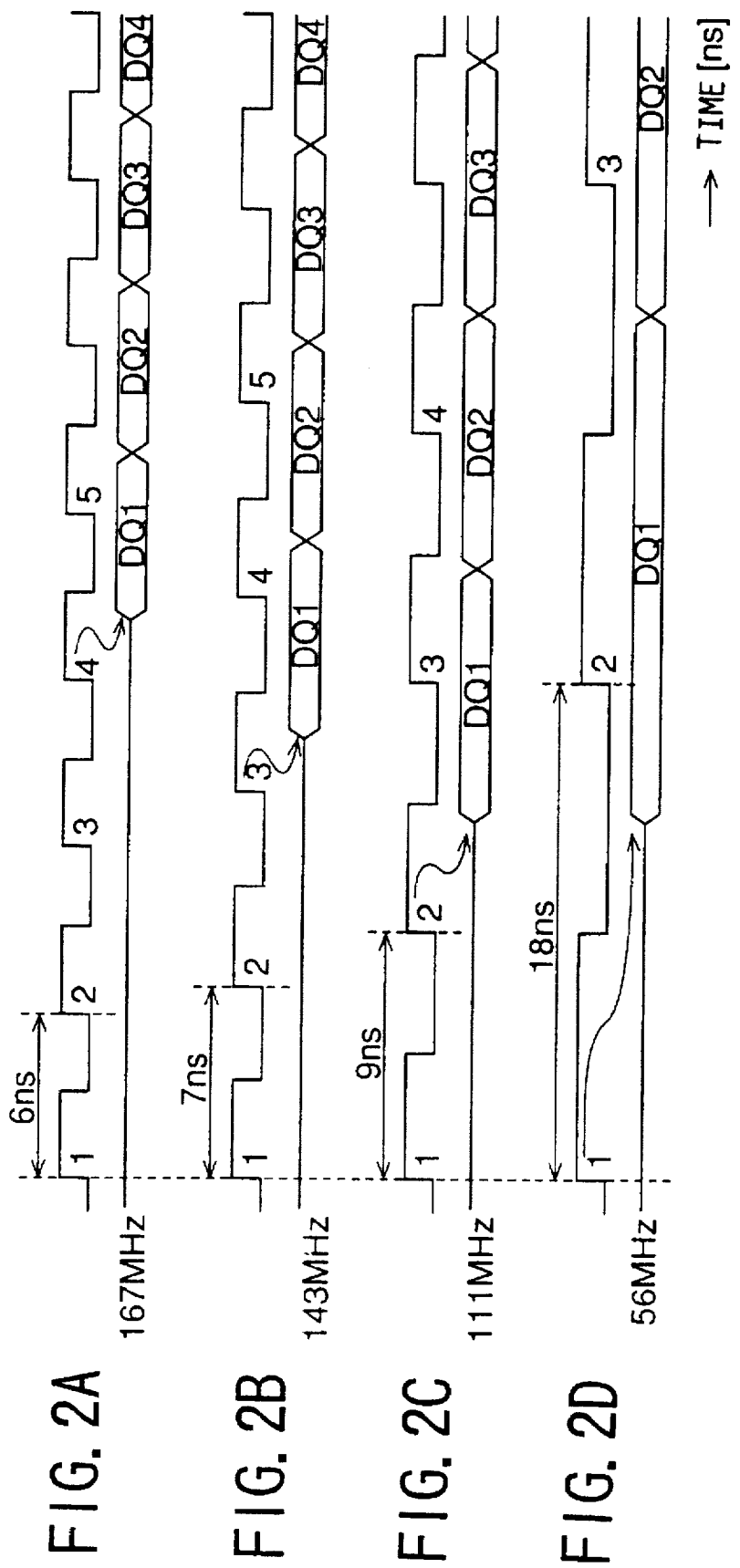
FIGS. 2A through 2D are time charts showing various data-read operations when a CAS latency is set to different values.
Figure 4:
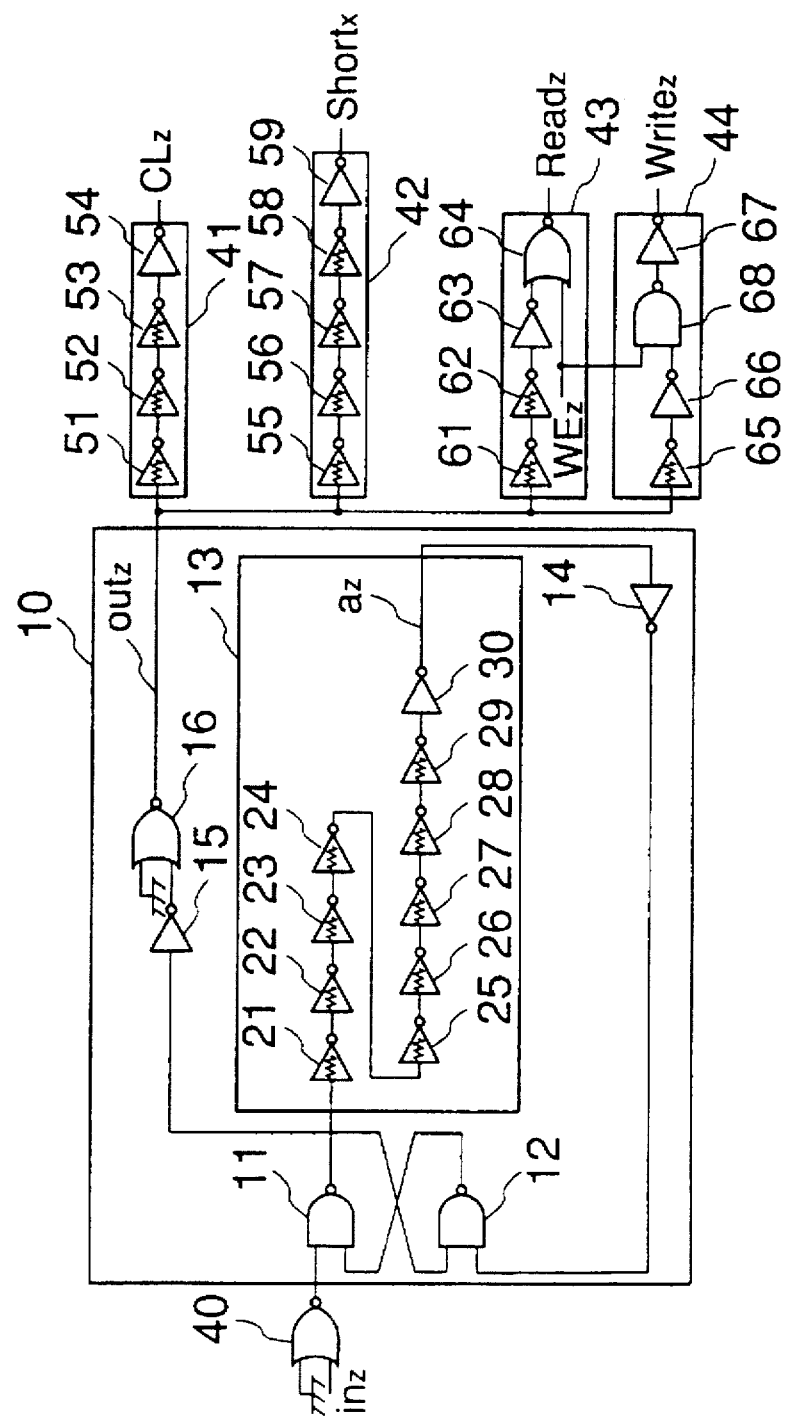
FIG. 4 is a circuit diagram of a circuit for controlling a column-line activation operation and a short-circuit operation.
Figure 5:
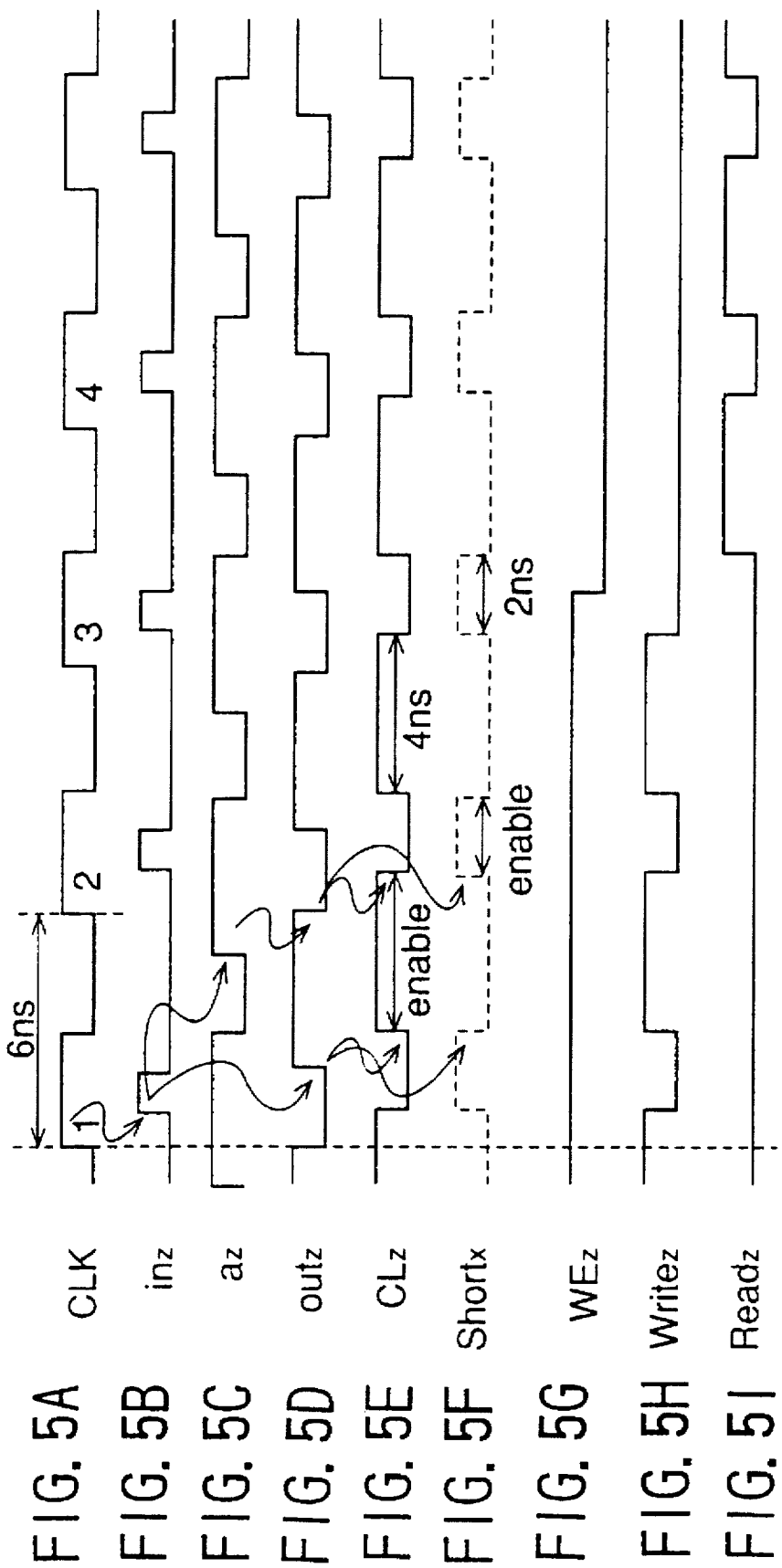
FIGS. 5A through 5I are time charts for explaining operations of the circuit of FIG. 4.
Figure 6:
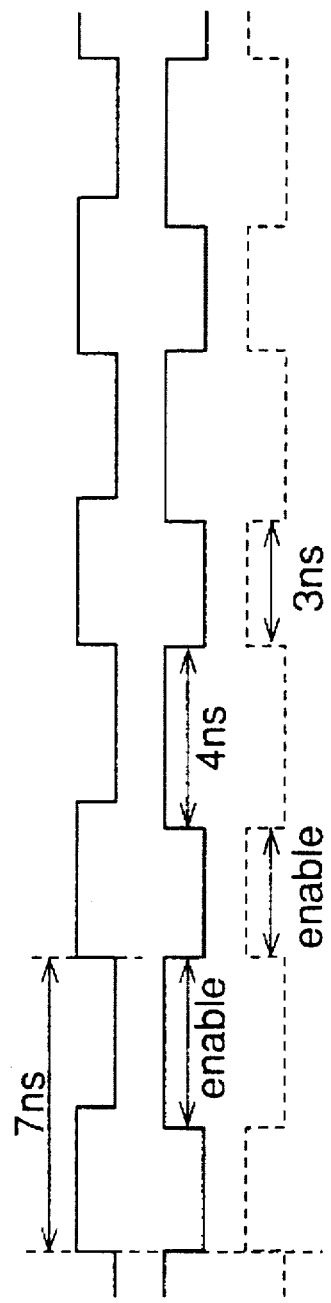
FIGS. 6A through 6C are time charts showing a case in which the CAS latency is 3 and one cycle is 7 ns.
Figure 7:
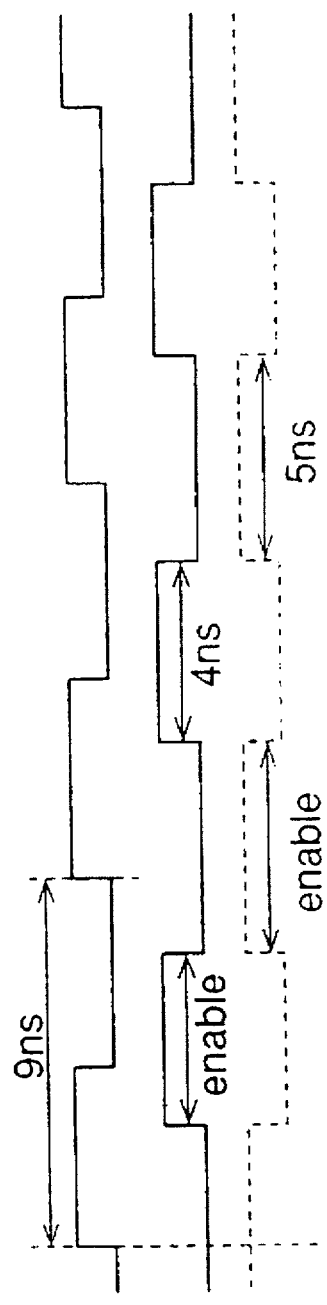
FIGS. 7A through 7C are time charts showing a case in which the CAS latency is 2 and one cycle is 9 ns.
Figure 8:
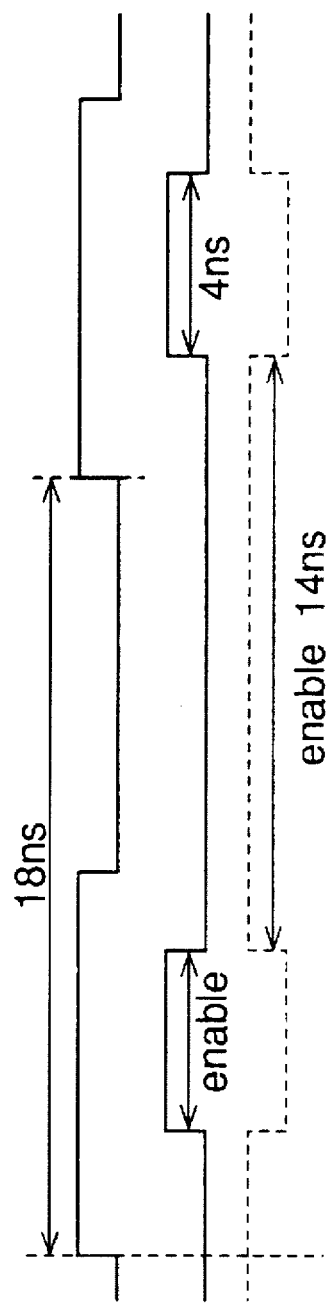
FIGS. 8A through 8C are time charts showing a case in which the CAS latency is 1 and one cycle is 18 ns.
Figure 10:
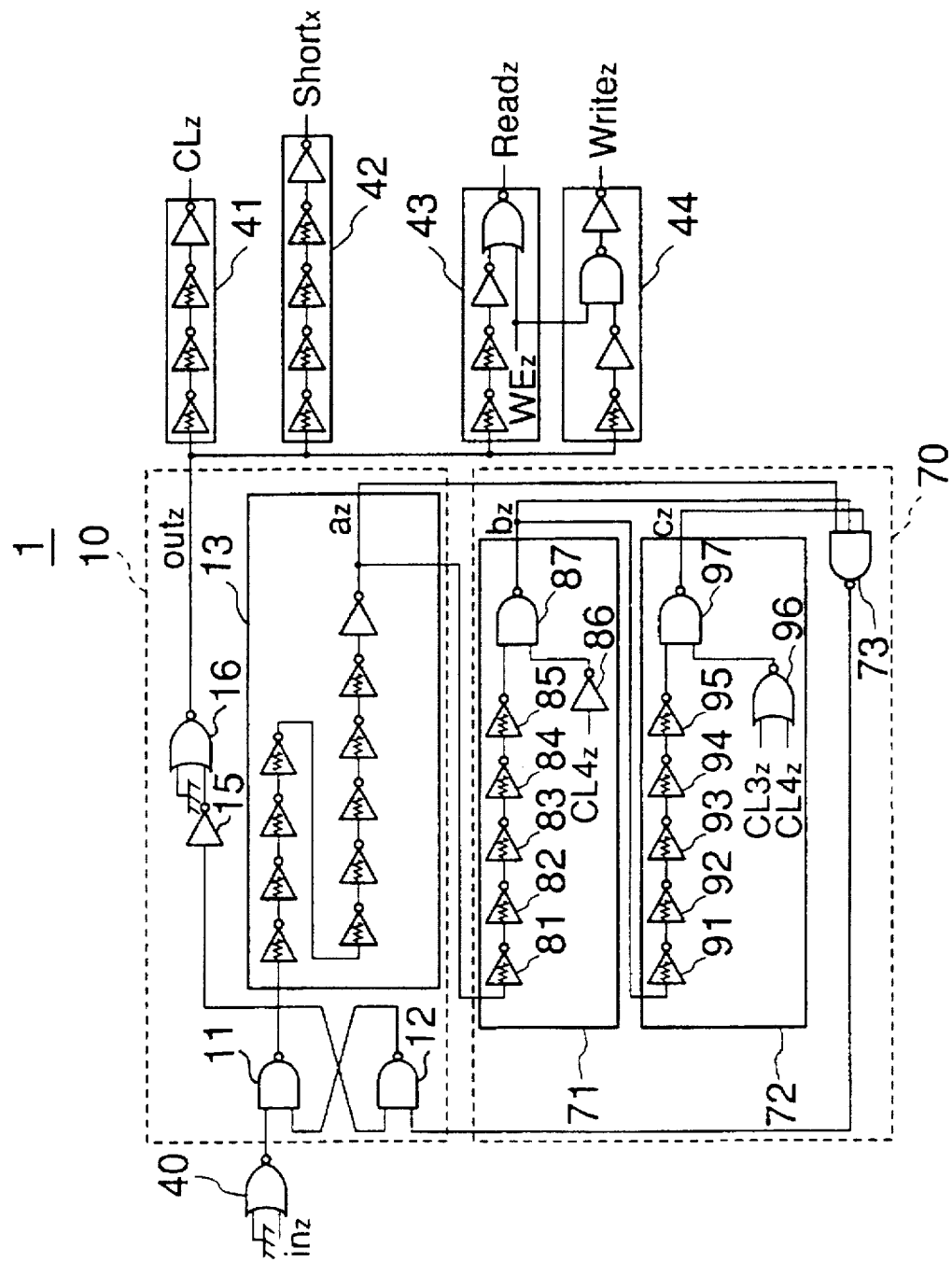
FIG. 10 is a circuit diagram of the read/write-control unit according to an embodiment of the present invention.

FIG. 10 is a circuit diagram of the read/write-control unit 1 according to an embodiment of the present invention. In FIG. 10, the same elements as those of FIG. 4 are referred to by the same numerals, and a description thereof will be omitted.

The read/write-control unit 1 of FIG. 10 includes the signal generating unit 10, the column-line-selection-signal controlling unit 41, the short-circuit-signal controlling unit 42, the Read-signal controlling unit 43, and the Write-signal controlling unit 44. These elements are basically the same as those shown in FIG. 4. The read/write-control unit 1 further includes the CAS-latency-control unit 70. The inverter 14 in the signal generating unit 10 shown in FIG. 4 is removed as the CAS-latency-control unit 70 is provided.

The CAS-latency-control unit 70 includes a first delay unit 71, a second delay unit 72, and a NAND circuit 73. The first delay unit 71 includes delay inverters 81 through 85, an inverter 86, and a NAND circuit 87. The second delay unit 72 includes delay inverters 91 through 95, a NOR circuit 96, and a NAND circuit 97.

FIGS. 11A through 11H are time charts for explaining operations of the circuit shown in FIG. 10. These time charts show a case when the CAS latency is set to 4 with a 6-ns cycle divided into a 4-ns column-line-activation period and a 2-ns short-circuit period.

In FIGS. 11A through 11H, a signal CLK is an external clock signal, a signal inz is an internal pulse signal, a signal az is an output of the delay unit 13, a signal bz is an output of the first delay unit 71 in the CAS-latency-control unit 70, a signal cz is an output of the second delay unit 72 in the CAS-latency-control unit 70, a signal outz is an output of the signal generating unit 10, a signal CLz is an output of the column-line-selection-signal controlling unit 41, and a signal Shortx is an output of the short-circuit-signal controlling unit 42.

With reference to FIG. 10 and FIGS. 11A through 11H, a change in the internal pulse signal inz from LOW to HIGH brings about a change in the state of the flip-flop comprised of the NAND circuits 11 and 12, so that the output of the NAND circuit 11 is turned to HIGH. This change in the output of the NAND circuit 11 is shown as a change from LOW to HIGH in the output signal outz shown in FIG. 11F. Also, the change in the output of the NAND circuit 11 is delayed by the delay unit 13 to appear as a rise from LOW to HIGH in the output signal az of the delay unit 13 shown in FIG. 11C.

Since FIGS. 11A through 11H show a case with the CAS latency of 4, only the CAS-latency indicating signal CL4z corresponding to the CAS latency of 4 is HIGH among the CAS-latency indicating signals CL1z through CL4z. The HIGH CAS-latency indicating signal CL4z produces a LOW output of the inverter 86 and a LOW output of the NOR circuit 96, resulting in the output signal bz of the first delay unit 71 and the output signal cz of the second delay unit 72 being HIGH. The NAND circuit 73 thus works as an inverter for the output signal az.

Figure 11:
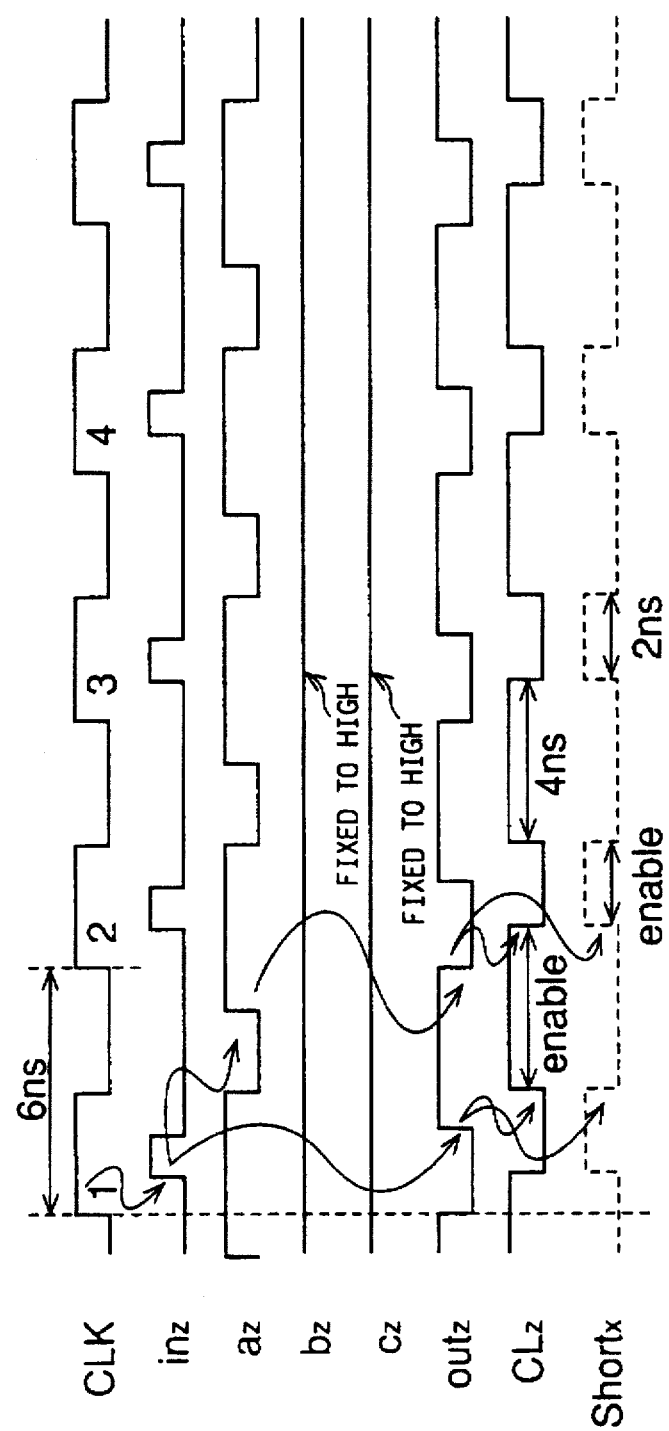
FIGS. 11A through 11H are time charts for explaining operations of the circuit shown in FIG. 10.

Since the output signal az is input to the flip-flop via the NAND circuit 73, the change from LOW to HIGH in the output signal az brings about a change in the output of the NAND circuit 11 from HIGH to LOW. This change is shown in FIG. 11F as a change in the output signal outz from HIGH to LOW. In this manner, with each rise in the internal pulse signal inz as a trigger, the output signal outz is turned to HIGH which lasts for a predetermined period (4 ns). This predetermined period is determined by the total delay time of the delay unit 13.

The column-line-selection-signal controlling unit 41 delays the output signal outz by a predetermined delay time to output the output signal CLz. The output signal CLz is shown in FIG. 11G, and corresponds to the column-line selecting signal CL in FIG. 3. The short-circuit-signal controlling unit 42 causes a delay of a predetermined amount to the output signal outz, and inverts the delayed signal to produce the output signal Shortx. The output signal Shortx is shown in FIG. 11H, and corresponds to the short-circuit signal SS of FIG. 3.

In this manner, the column-line selecting signal CL (CLz) shown in FIG. 11G is provided as a signal having reversed phase relations with the short-circuit signal SS (Shortx) shown in FIG. 11H. The HIGH period of the column-line selecting signal CL which is determined by the delay time of the delay unit 13 is 4 ns, and one cycle lasts for 6 ns, so that the short-circuit signal SS has a HIGH period of 2 ns. In other words, the column-line activation operation and the short-circuit operation divide one cycle at a ratio of 2 to 1 into 4 ns and 2 ns, respectively.

FIGS. 12A through 12H are time charts for explaining operations of the circuit shown in FIG. 10. These time charts show a case in which the CAS latency is set to 3 with a 7-ns cycle divided into a 4.6-ns column-line-activation period and a 2.4-ns short-circuit period.

With reference to FIG. 10 and FIGS. 12A through 12H, a change in the internal pulse signal inz from LOW to HIGH brings about a change in the state of the flip-flop comprised of the NAND circuits 11 and 12, so that the output of the NAND circuit 11 is turned to HIGH. This change in the output of the NAND circuit 11 is shown as a change from LOW to HIGH in the output signal outz shown in FIG. 12F. Also, the change in the output of the NAND circuit 11 is delayed by the delay unit 13 to appear as a rise from LOW to HIGH in the output signal az of the delay unit 13 shown in FIG. 12C.

Figure 12:
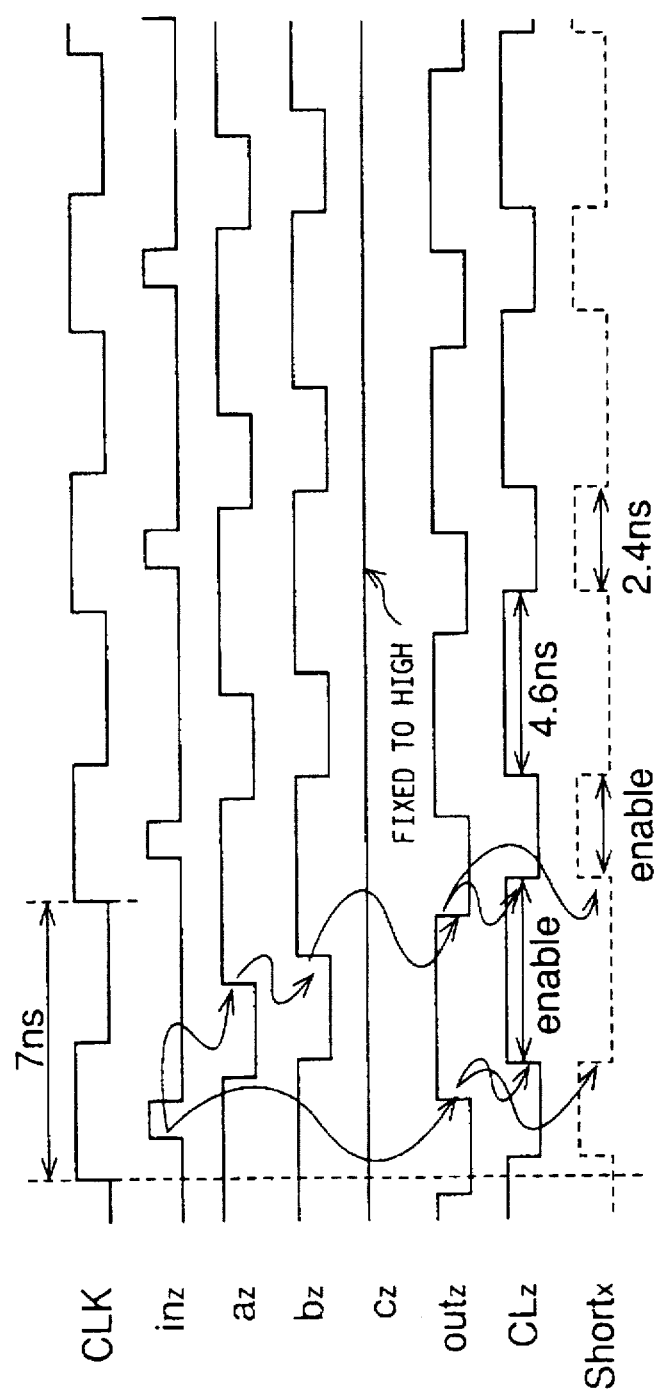
FIGS. 12A through 12H are time charts for explaining operations of the circuit shown in FIG. 10.

Since FIGS. 12A through 12H show a case with the CAS latency of 3, only the CAS-latency indicating signal CL3z corresponding to the CAS latency of 3 is HIGH among the CAS-latency indicating signals CL1z through CL4z. The LOW CAS-latency indicating signal CL4z produces a HIGH output of the inverter 86, so that the NAND circuit 87 of the first delay unit 71 serves as an inverter. As a result, the signal az input to the first delay unit 71 is delayed by a predetermined delay amount by the first delay unit 71, and is supplied to the NAND circuit 73 as the output signal bz (FIG. 12D).

Further, the HIGH CAS-latency indicating signal CL3z produces a LOW output of the NOR circuit 96, resulting in the output signal cz of the second delay unit 72 being HIGH. At the NAND circuit 73, this output signal cz can be ignored since it is HIGH.

Since a NAND logic of the output signal az and the output signal bz is supplied from the NAND circuit 73 to the flip-flop, a change in the output signal bz from LOW to HIGH causes a change in the output of the NAND circuit 11 of the flip-flop from HIGH to LOW. This change appears as a change from HIGH to LOW in the output signal outz as shown in FIG. 12F. In this manner, with each rise in the internal pulse signal inz as a trigger, the output signal outz is turned to HIGH which lasts for a predetermined period (4.6 ns). This predetermined period is determined by the total delay time of the delay unit 13 and the first delay unit 71.

The column-line-selection-signal controlling unit 41 delays the output signal outz by a predetermined delay time to output the output signal CLz. The output signal CLz is shown in FIG. 12G, and corresponds to the column-line selecting signal CL in FIG. 3. The short-circuit-signal controlling unit 42 causes a delay of a predetermined amount to the output signal outz, and inverts the delayed signal to produce the output signal Shortx. The output signal Shortx is shown in FIG. 12H, and corresponds to the short-circuit signal SS of FIG. 3.

In this manner, the column-line selecting signal CL (CLz) shown in FIG. 12G is provided as a signal having reversed phase relations with the short-circuit signal SS (Shortx) shown in FIG. 12H. The HIGH period of the column-line selecting signal CL which is determined by the total delay time of the delay unit 13 and the first delay unit 71 is 4.6 ns, and one cycle lasts for 7 ns, so that the short-circuit signal SS has a HIGH period of 2.4 ns. In other words, the column-line activation operation and the short-circuit operation divide one cycle at a ratio of 2 to 1 into 4.6 ns and 2.4 ns, respectively.

FIGS. 13A through 13H are time charts for explaining operations of the circuit shown in FIG. 10. These time charts show a case in which the CAS latency is set to 2 with a 9-ns cycle divided into a 6-ns column-line-activation period and a 3-ns short-circuit period.

With reference to FIG. 10 and FIGS. 13A through 13H, a change in the internal pulse signal inz from LOW to HIGH brings about a change in the state of the flip-flop comprised of the NAND circuits 11 and 12, so that the output of the NAND circuit 11 is turned to HIGH. This change in the output of the NAND circuit 11 is shown as a change from LOW to HIGH in the output signal outz shown in FIG. 13F. Also, the change in the output of the NAND circuit 11 is delayed by the delay unit 13 to appear as a rise from LOW to HIGH in the output signal az of the delay unit 13 shown in FIG. 13C.

Figure 13:
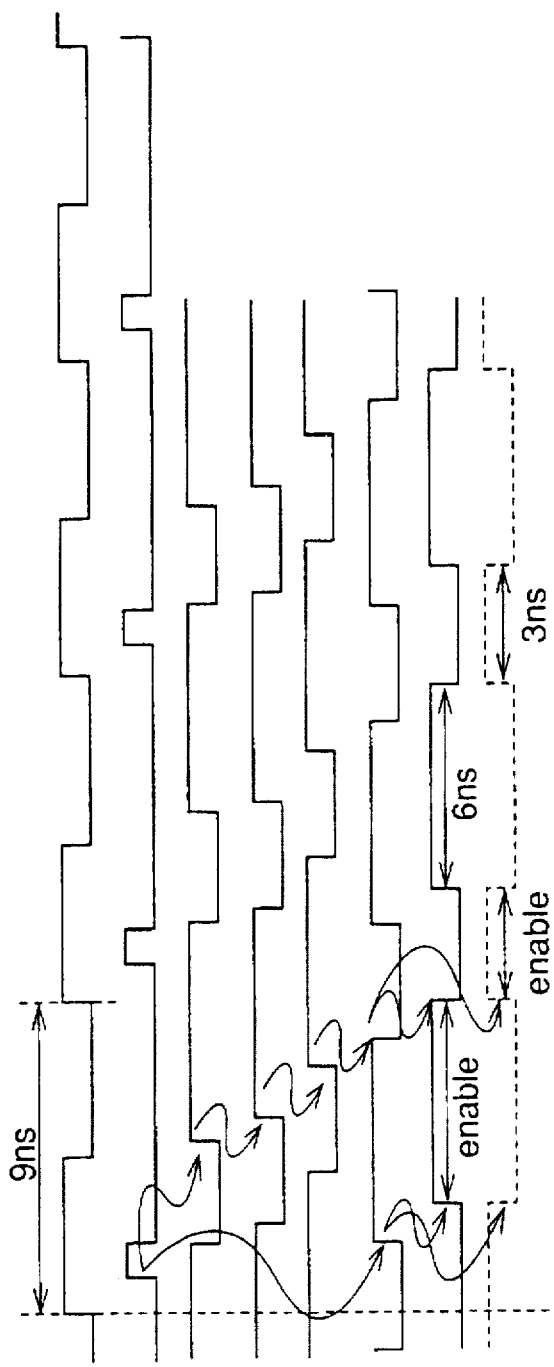
FIGS. 13A through 13H are time charts for explaining operations of the circuit shown in FIG. 10.

Since FIGS. 13A through 13H show a case with the CAS latency of 2, only the CAS-latency indicating signal CL2z corresponding to the CAS latency of 2 is HIGH among the CAS-latency indicating signals CL1z through CL4z. The LOW CAS-latency indicating signal CL4z produces a HIGH output of the inverter 86, so that the NAND circuit 87 of the first delay unit 71 serves as an inverter. As a result, the signal az input to the first delay unit 71 is delayed by a predetermined delay amount by the first delay unit 71, and is supplied to the NAND circuit 73 and the second delay unit 72 as the output signal bz (FIG. 13D).

In the second delay unit 72, both of the CAS-latency indicating signals CL4z and CL3z are LOW to produce a HIGH output of the NOR circuit 96, so that the NAND circuit 97 operates as an inverter. As a result, the second delay unit 72 causes a predetermined delay to the signal bz without inverting it to supply the delayed signal bz as an output signal cz to the NAND circuit 73.

Since a NAND logic of the output signal az, the output signal bz, and the output signal cz is supplied from the NAND circuit 73 to the flip-flop, a change in the output signal cz from LOW to HIGH causes a change in the output of the NAND circuit 11 of the flip-flop from HIGH to LOW. This change appears as a change from HIGH to LOW in the output signal outz as shown in FIG. 13F. In this manner, with each rise in the internal pulse signal inz as a trigger, the output signal outz is turned to HIGH which lasts for a predetermined period (6 ns). This predetermined period is determined by the total delay time of the delay unit 13, the first delay unit 71, and the second delay unit 72.

The column-line-selection-signal controlling unit 41 delays the output signal outz by a predetermined delay time to output the output signal CLz. The output signal CLz is shown in FIG. 13G, and corresponds to the column-line selecting signal CL in FIG. 3. The short-circuit-signal controlling unit 42 causes a delay of a predetermined amount to the output signal outz, and inverts the delayed signal to produce the output signal Shortx. The output signal Shortx is shown in FIG. 13H, and corresponds to the short-circuit signal SS of FIG. 3.

In this manner, the column-line selecting signal CL (CLz) shown in FIG. 13G is provided as a signal having reversed phase relations with the short-circuit signal SS (Shortx) shown in FIG. 13H. The HIGH period of the column-line selecting signal CL which is determined by the total delay time of the delay unit 13, the first delay unit 71, and the second delay unit 72 is 6 ns. Since one cycle lasts for 9 ns, the short-circuit signal SS has a HIGH period of 3 ns. In other words, the column-line activation operation and the short-circuit operation divide one cycle at a ratio of 2 to 1 into 6 ns and 3 ns, respectively.

Figure 14:
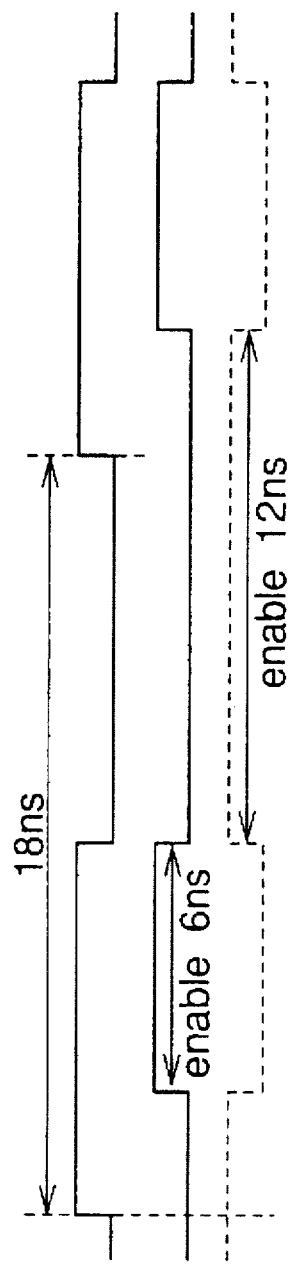
FIGS. 14A through 14C are time charts for explaining operations of the circuit shown in FIG. 10.

FIGS. 14A through 14C are time charts for explaining operations of the circuit shown in FIG. 10. These time charts show a case in which the CAS latency is set to 1 with a 18-ns cycle divided into a 6-ns column-line-activation period and a 12-ns short-circuit period.

Since FIGS. 14A through 14C show a case with the CAS latency of 1, only the CAS-latency indicating signal CL1z corresponding to the CAS latency of 1 is HIGH among the CAS-latency indicating signals CL1z through CL4z. With the CAS-latency indicating signals CL4z and CL3z being LOW, the circuit of FIG. 10 operates in the same manner as in the case of the CAS latency of 2.

Accordingly, the column-line selecting signal CL (CLz) shown in FIG. 14B is provided as a signal having reversed phase relations with the short-circuit signal SS (Shortx) shown in FIG. 14C. The HIGH period of the column-line selecting signal CL which is determined by the total delay time of the delay unit 14, the first delay unit 71, and the second delay unit 72 is 6 ns as in the previous case. Since once cycle is 18 ns in this case, however, the short-circuit signal SS has a HIGH period of 12 ns. In other words, the column-line activation operation and the short-circuit operation divide one cycle at a ratio of 1 to 2 into 6 ns and 12 ns, respectively.

In this embodiment, the same column-line-activation time is used in the case of the CAS latency of 1 as that used in the case of the CAS latency of 2. This is because a sufficient margin is likely to be provided for the column-line-activation time in the case of the CAS latency of 1, so that the same settings as those of the CAS latency of 2 can be used without providing a delay unit dedicated for the CAS latency of 1. Such a configuration is preferable when taking into consideration a circuit space which would be needed for providing an additional delay unit. It is apparent, however, that the column-line-activation operation and the short-circuit operation can be set to a 2-to-1 ratio dividing one cycle by providing a third delay unit for the CAS latency of 1.

Figure 15:
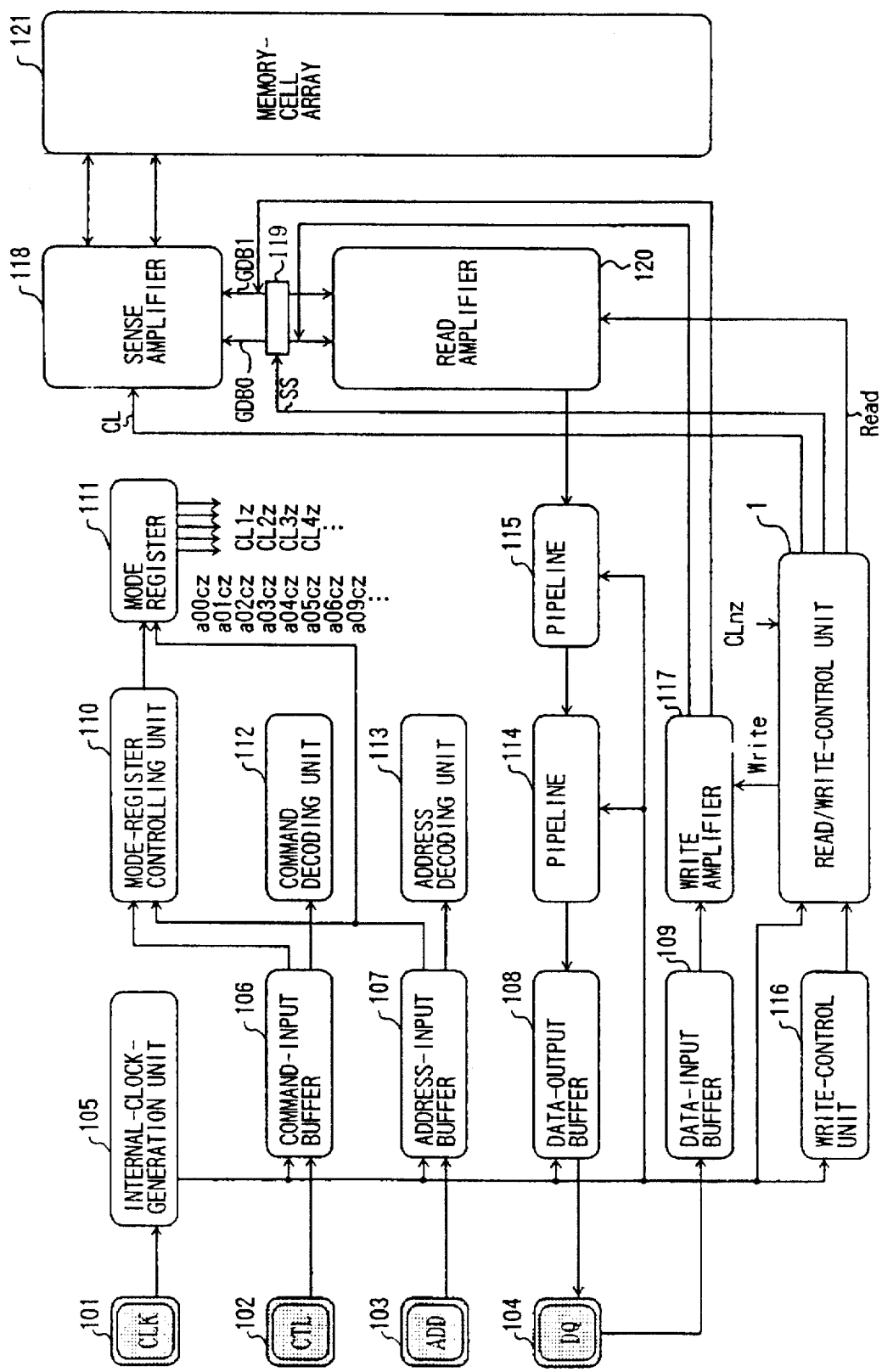
FIG. 15 is a block diagram of an SDRAM according to the present invention.

FIG. 15 is a block diagram of an SDRAM according to the present invention. The SDRAM of FIG. 15 includes a clock-signal-input node 101, a command-signal-input node 102, an address-signal-input node 103, a data-signal-input/output node 104, an internal-clock-generation unit 105, a command-input buffer 106, an address-input buffer 107, a data-output buffer 108, a data-input buffer 109, a mode-register controlling unit 110, a mode register 111, a command decoding unit 112, an address decoding unit 113, pipelines 114 and 115, a write-control unit 116, a write amplifier 117, a sense amplifier 118, a short-circuit circuit 119, a read amplifier 120, a memory-cell array 121, and the read/write-control unit 1 of FIG. 9.

The circuit of FIG. 10, for example, is used as the read/write-control unit 1 in the SDRAM of FIG. 15. The SDRAM of FIG. 15 is the same as a conventional SDRAM, except that the circuit of FIG. 10 rather than the circuit of FIG. 4 is used as the read/write-control unit 1.

In the following, operations of the SDRAM of FIG. 15 will be described in brief. A clock signal input to the clock-signal-input node 101 is supplied to the internal-clock-generation unit 105, which generates various internal clock signals for controlling the internal circuits. Based on internal clock signals generated by the internal-clock-generation unit 105, the command-input buffer 106, the address-input buffer 107, and the data-input buffer 109 read a command signal, an address signal, and a data signal from the command-signal-input node 102, the address-signal-input node 103, and the data-signal-input/output node 104, respectively.

The command signal is supplied from the command-input buffer 106 to the command decoding unit 112 to be decoded. Based on the decoding results, the internal circuits are controlled. When a mode-register setting command is provided as a command, the mode-register controlling unit 110 writes an address signal from the address-input buffer 107 in the mode register 111 in response to the mode-register setting command.

The address signal is supplied from the address-input buffer 107 to the address decoding unit 113 for decoding. Based on the address decoding results, the memory-cell array 121 is accessed at an indicated address thereof.

The data signal is stored in the memory-cell array 121 at the indicated address thereof, supplied from the data-input buffer 109 via the write amplifier 117 and the sense amplifier 118. On the other hand, data read from the memory-cell array 121 at the indicated address thereof is supplied to the data-output buffer 108 via the sense amplifier 118, the read amplifier 120, and the pipelines 114 and 115. The data-output buffer 108 outputs the data to data-signal-input/output node 104 based on an internal clock generated by the internal-clock-generation unit 105.

The write-control unit 116 supplies a Read/Write indicating signal of FIG. 9 (WEz of FIG. 10) to the read/write-control unit 1 in accordance with the command decoding results of the command decoding unit 112. Also, based on the command decoding results, the write-control unit 116 controls the data-input buffer 109.

The mode register 111 outputs the CAS-latency indicating signals CL1z through CL4z which indicate which CAS latency is being used. (When CAS latencies can be set to more than 4, a CAS-latency indicating signal CL5z and so on are also output.) The CAS-latency indicating signals CL1z through CL4z are provided to the read/write-control unit 1.

As previously described, the read/write-control unit 1 generates the column-line selecting signal CL, the short-circuit signal SS, the data-write signal Write, and the data-read signal Read. The column-line selecting signal CL is supplied to the sense amplifier 118 comprised of a plurality of sense amplifiers, and enables a data-read/data-write operation of a selected sense amplifier for a predetermined time period (column-line-activation period). The short-circuit signal SS is provided to the short-circuit circuit 119, which short-circuits global data bus GDB0 and GDB1 for a predetermined time period (short-circuit period). The data-write signal Write is fed to the write amplifier 117 to supply the input data from the data-input buffer 109 to the global data bus GDB0 and GDB1 at a predetermined timing. The data-read signal Read is supplied to the read amplifier 120 to provide the read data on the global data bus GDB0 and GDB1 to the pipeline 115 at a predetermined timing.

As previously described, the read/write-control unit 1 increases the column-line-activation period and the short-circuit period as the operation speed decreases from near the operation limit corresponding to the CAS latency of 4, so that sufficient margins are provided for both the column-line-activation period and the short-circuit period when CAS latencies other than 4 are used. Accordingly, even if an SDRAM chip is defective in a sense that it is inoperable using the column-line-activation period and the short-circuit period which are set for the CAS latency corresponding to the fastest clock, this SDRAM chip is likely to be operable with other CAS latencies.

Further, the present invention is not limited to these embodiments, but various variations and modifications may be made without departing from the scope of the present invention.

What is claimed is:

1. A DRAM to which a setting can be made to determine an internal operation frequency thereof, said DRAM comprising:
   a memory cell array;
   sense amplifiers writing data to and reading data from said memory cell array;
   a pair of data-bus lines;
   gates connected between said pair of data-bus lines and said sense amplifiers, said gates providing said pair of data-bus lines with access to said sense amplifiers when said gates are ON; and
   a control circuit controlling a period of ON state of said gates in response to said internal operation frequency.

2. The DRAM as claimed in claim 1, further comprising a short-circuit circuit short-circuiting said pair of data-bus lines with each other, wherein said control circuit controlling a period of said short-circuiting to be a different period for a different setting of said internal operation frequency.

3. The DRAM as claimed in claim 2, wherein said control circuit comprises:
   a signal generating unit generating at least one signal, a pulse length of which determines said period of said ON state and said period of said short-circuiting; and
   a pulse-length controlling unit controlling said pulse length based on said setting of said internal operation frequency.

4. The DRAM as claimed in claim 2, further comprising a mode register storing a parameter to define an operation mode of said DRAM, wherein said control circuit determines said period of said ON state and said period of said short-circuiting based on said parameter.

5. The DRAM as claimed in claim 4, wherein said parameter comprises a CAS-latency parameter.

6. The DRAM as claimed in claim 5, wherein said control circuit comprises:
   a signal generating unit generating at least one signal, a pulse length of which determines said period of said ON state and said period of said short-circuiting; and
   a pulse-length controlling unit controlling said pulse length based on said CAS-latency parameter.

7. The DRAM as claimed in claim 6, wherein said pulse-length controlling unit comprises means for controlling said pulse length such that a ratio between said period of said ON state and said period of said short-circuiting is kept constant over different settings of said CAS-latency parameter.

8. The DRAM as claimed in claim 6, wherein said pulse-length controlling unit comprises means for controlling said pulse length such that said ratio is kept constant over at least two of said different settings, and for keeping said pulse length unchanged for remaining settings.

9. The DRAM as claimed in claim 1, wherein said gates comprise column-gate transistors, and said control unit generates at least one signal to be supplied to gate inputs of said column-gate transistors, said at least one signal having a pulse length which is controlled based on said internal operation frequency to define said period of said ON state.

10. A method of setting an internal operation frequency of a DRAM, said DRAM having sense amplifiers writing data to and reading data from a memory cell array and having a pair of data-bus lines connected to said sense amplifiers via gates, wherein a period of said gate opening to provide said pair of data-bus lines with access to said amplifiers is determined by a first pulse length, and a period of said pair of said data-bus lines being short-circuited is determined by a second pulse length, said method comprising the steps of:
   a) storing a parameter in a mode register, said parameter defining an operation mode of said DRAM; and
   b) determining said first pulse length and said second pulse length based on said parameter, each of said first pulse length and said second pulse length being different for a different setting of said parameter.

11. The method as claimed in claim 10, wherein said parameter comprises a CAS-latency parameter.

12. The method as claimed in claim 11, wherein said step b) determines said first pulse length and said second pulse length such that a ratio between said first pulse length and said second pulse length is kept constant regardless of a setting of said parameter.

* * * * *